US008224265B1

(12) United States Patent
Mahoney

(10) Patent No.: US 8,224,265 B1
(45) Date of Patent: Jul. 17, 2012

(54) METHOD FOR OPTIMIZING AM/AM AND AM/PM PREDISTORTION IN A MOBILE TERMINAL

(75) Inventor: Dennis Mahoney, High Point, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 1539 days.

(21) Appl. No.: 11/151,022

(22) Filed: Jun. 13, 2005

(51) Int. Cl.
*H04B 1/04* (2006.01)

(52) U.S. Cl. ............... 455/114.3; 455/102; 455/127.1; 375/297

(58) Field of Classification Search .......... 455/102, 455/114.2–114.3, 126–127.4; 375/296–297
See application file for complete search history.

(56) References Cited

U.S. PATENT DOCUMENTS

| | | | |
|---|---|---|---|
| 3,900,823 A * | 8/1975 | Sokal et al. | ........... 330/149 |
| 4,389,618 A | 6/1983 | Bauman | |
| 4,609,881 A | 9/1986 | Wells | |
| 4,837,786 A | 6/1989 | Gurantz et al. | |
| 4,870,371 A * | 9/1989 | Gottwald et al. | ........... 330/149 |
| 4,968,908 A | 11/1990 | Walls | |
| 5,055,802 A | 10/1991 | Hietala et al. | |
| 5,079,522 A | 1/1992 | Owen et al. | |
| 5,313,411 A | 5/1994 | Tsujimoto | |
| 5,430,416 A | 7/1995 | Black et al. | |
| 5,444,415 A | 8/1995 | Dent et al. | |
| 5,524,286 A | 6/1996 | Chiesa et al. | |
| 5,598,436 A | 1/1997 | Brajal et al. | |
| 5,608,353 A | 3/1997 | Pratt | |
| 5,617,450 A | 4/1997 | Kakuishi et al. | |
| 5,629,648 A | 5/1997 | Pratt | |
| 5,822,011 A | 10/1998 | Rumreich | |
| 5,825,257 A | 10/1998 | Klymyshyn et al. | |
| 5,900,778 A * | 5/1999 | Stonick et al. | ........... 330/149 |
| 5,948,052 A | 9/1999 | Toler | |
| 5,952,895 A | 9/1999 | McCune, Jr. et al. | |
| 6,008,703 A | 12/1999 | Perrott et al. | |
| 6,101,224 A | 8/2000 | Lindoff et al. | |
| 6,115,684 A | 9/2000 | Kawahara et al. | |
| 6,130,579 A | 10/2000 | Iyer et al. | |
| 6,141,390 A * | 10/2000 | Cova | ........... 375/297 |
| 6,141,541 A * | 10/2000 | Midya et al. | ........... 455/91 |
| 6,191,656 B1 | 2/2001 | Nadler | |
| 6,211,747 B1 | 4/2001 | Trichet et al. | |

(Continued)

OTHER PUBLICATIONS

Andraka, Ray, "A Survey of CORDIC Algorithms for FPGA Based Computers," Association for Computing Machinery, 0-89791-978-5, 1998.

(Continued)

*Primary Examiner* — Edward Urban
*Assistant Examiner* — Rui Hu
(74) *Attorney, Agent, or Firm* — Withrow & Terranova, P.L.L.C.

(57) ABSTRACT

A method is provided for optimizing Amplitude Modulation to Amplitude Modulation (AM/AM) and Amplitude Modulation to Phase Modulation (AM/PM) predistortion of a polar modulated transmit signal in a mobile terminal in order to optimize an Output Radio Frequency Spectrum (OFRS) of the mobile terminal. The AM/AM and AM/PM predistortion of the polar modulated transmit signal compensates for AM/AM and AM/PM distortion of a power amplifier in the transmit chain of the mobile terminal. However, the AM/AM and AM/PM distortion of the power amplifier cannot be easily measured or computed. Accordingly, the present invention provides a system and method for optimizing coefficients for polynomials defining the AM/AM and AM/PM predistortion of the polar modulated transmit signal based on optimizing the OFRS of the mobile terminal.

18 Claims, 7 Drawing Sheets

U.S. PATENT DOCUMENTS

| | | |
|---|---|---|
| 6,229,395 B1 | 5/2001 | Kay |
| 6,236,687 B1 | 5/2001 | Caso et al. |
| 6,236,703 B1 | 5/2001 | Riley |
| 6,236,837 B1 * | 5/2001 | Midya ............................ 455/63.1 |
| 6,240,278 B1 * | 5/2001 | Midya et al. ................... 455/126 |
| 6,246,286 B1 | 6/2001 | Persson |
| 6,271,727 B1 | 8/2001 | Schmukler |
| 6,275,685 B1 | 8/2001 | Wessel et al. |
| 6,285,239 B1 | 9/2001 | Iyer et al. |
| 6,288,610 B1 | 9/2001 | Miyashita |
| 6,295,442 B1 | 9/2001 | Camp, Jr. et al. |
| RE37,407 E | 10/2001 | Eisenberg et al. |
| 6,307,364 B1 | 10/2001 | Augustine |
| 6,320,463 B1 * | 11/2001 | Leva et al. ..................... 330/149 |
| 6,329,809 B1 | 12/2001 | Dening et al. |
| 6,335,767 B1 | 1/2002 | Twitchell et al. |
| 6,356,150 B1 | 3/2002 | Spears et al. |
| 6,359,950 B2 | 3/2002 | Gossmann et al. |
| 6,366,177 B1 | 4/2002 | McCune et al. |
| 6,377,784 B2 | 4/2002 | McCune |
| 6,392,487 B1 | 5/2002 | Alexanian |
| 6,396,345 B2 * | 5/2002 | Dolman ........................ 330/149 |
| 6,417,731 B1 | 7/2002 | Funada et al. |
| 6,462,617 B1 | 10/2002 | Kim |
| 6,489,846 B2 | 12/2002 | Hatsugai |
| 6,504,885 B1 | 1/2003 | Chen |
| 6,522,121 B2 | 2/2003 | Coumou |
| 6,581,082 B1 | 6/2003 | Opsahl |
| 6,587,514 B1 | 7/2003 | Wright et al. |
| 6,642,786 B1 * | 11/2003 | Jin et al. ........................ 330/149 |
| H2143 H | 2/2004 | Prockup |
| 6,693,468 B2 * | 2/2004 | Humphreys et al. .......... 327/105 |
| 6,700,929 B1 | 3/2004 | Shan et al. |
| 6,701,134 B1 | 3/2004 | Epperson |
| 6,701,138 B2 | 3/2004 | Epperson et al. |
| 6,710,664 B2 * | 3/2004 | Humphreys et al. ............. 331/11 |
| 6,720,831 B2 | 4/2004 | Dening et al. |
| 6,724,252 B2 | 4/2004 | Ngo et al. |
| 6,724,265 B2 | 4/2004 | Humphreys |
| 6,724,831 B1 | 4/2004 | Hasegawa et al. |
| 6,728,324 B1 | 4/2004 | Shan et al. |
| 6,731,145 B1 | 5/2004 | Humphreys et al. |
| 6,735,419 B2 | 5/2004 | Mitzlaff |
| 6,748,204 B1 | 6/2004 | Razavi et al. |
| 6,782,244 B2 | 8/2004 | Steel et al. |
| 6,798,843 B1 * | 9/2004 | Wright et al. ................. 375/296 |
| 6,801,086 B1 * | 10/2004 | Chandrasekaran ........... 330/140 |
| 6,807,406 B1 | 10/2004 | Razavi et al. |
| 6,816,718 B2 | 11/2004 | Yan et al. |
| 6,819,914 B2 | 11/2004 | Yan et al. |
| 6,819,941 B2 | 11/2004 | Dening et al. |
| 6,831,506 B1 | 12/2004 | Moffat et al. |
| 6,834,084 B2 * | 12/2004 | Hietala ......................... 375/296 |
| 6,836,517 B2 | 12/2004 | Nagatani et al. |
| 6,853,836 B2 | 2/2005 | Asam et al. |
| 6,900,778 B1 | 5/2005 | Yamamoto |
| 6,901,039 B1 | 5/2005 | Sugie et al. |
| 6,901,514 B1 | 5/2005 | Iu et al. |
| 6,903,604 B2 | 6/2005 | Kim |
| 6,914,943 B2 | 7/2005 | Shimizu |
| 6,963,242 B2 * | 11/2005 | White et al. ................... 330/149 |
| 6,975,688 B2 | 12/2005 | Rexberg et al. |
| 7,010,276 B2 | 3/2006 | Sander et al. |
| 7,010,280 B1 | 3/2006 | Wilson |
| 7,012,969 B2 | 3/2006 | Ode et al. |
| 7,054,385 B2 | 5/2006 | Booth et al. |
| 7,084,704 B2 | 8/2006 | Sowlati |
| 7,098,754 B2 * | 8/2006 | Humphreys et al. .......... 332/103 |
| 7,109,791 B1 | 9/2006 | Epperson et al. |
| 7,110,724 B1 * | 9/2006 | Epperson et al. ................ 455/72 |
| 7,113,036 B2 | 9/2006 | Moffatt et al. |
| 7,113,551 B2 | 9/2006 | Sills et al. |
| 7,132,891 B1 | 11/2006 | Dening et al. |
| 7,145,385 B2 | 12/2006 | Brandt et al. |
| 7,158,494 B2 | 1/2007 | Sander et al. |
| 7,349,490 B2 | 3/2008 | Hunton |
| 7,369,813 B2 | 5/2008 | Andersson |
| 7,372,917 B2 | 5/2008 | Jensen |
| 7,457,586 B1 | 11/2008 | Hietala et al. |
| 7,529,523 B1 | 5/2009 | Young et al. |
| 7,542,520 B1 | 6/2009 | Estrada |
| 7,551,686 B1 | 6/2009 | Coons et al. |
| 7,593,698 B1 | 9/2009 | Johnson et al. |
| 2001/0022532 A1 | 9/2001 | Dolman |
| 2001/0033238 A1 * | 10/2001 | Velazquez ..................... 341/118 |
| 2002/0008578 A1 | 1/2002 | Wright et al. |
| 2002/0021764 A1 | 2/2002 | Posti |
| 2002/0041210 A1 | 4/2002 | Booth et al. |
| 2002/0044014 A1 | 4/2002 | Wright et al. |
| 2002/0060606 A1 * | 5/2002 | Andre ........................... 330/149 |
| 2002/0093378 A1 | 7/2002 | Nielsen et al. |
| 2002/0113905 A1 | 8/2002 | Lee |
| 2002/0160821 A1 | 10/2002 | Kaikati et al. |
| 2002/0167923 A1 | 11/2002 | Sendonaris et al. |
| 2003/0012289 A1 | 1/2003 | Lindoff |
| 2003/0020538 A1 | 1/2003 | Kim |
| 2003/0087617 A1 | 5/2003 | Shohara |
| 2003/0133518 A1 | 7/2003 | Koomullil et al. |
| 2003/0161487 A1 | 8/2003 | Husted et al. |
| 2003/0179830 A1 | 9/2003 | Eidson et al. |
| 2003/0197558 A1 | 10/2003 | Bauder et al. |
| 2003/0197559 A1 | 10/2003 | Ghannouchi et al. |
| 2003/0215025 A1 * | 11/2003 | Hietala .......................... 375/297 |
| 2003/0215026 A1 * | 11/2003 | Hietala .......................... 375/297 |
| 2003/0227342 A1 | 12/2003 | Liu |
| 2004/0061555 A1 * | 4/2004 | Lynch ........................... 330/136 |
| 2004/0072597 A1 | 4/2004 | Epperson et al. |
| 2004/0116083 A1 * | 6/2004 | Suzuki et al. .................. 455/126 |
| 2004/0121741 A1 | 6/2004 | Rashev et al. |
| 2004/0131129 A1 | 7/2004 | Harron et al. |
| 2004/0161053 A1 * | 8/2004 | Cavers et al. .................. 375/297 |
| 2004/0179629 A1 * | 9/2004 | Song et al. .................... 375/296 |
| 2004/0183511 A1 | 9/2004 | Dening |
| 2004/0198414 A1 | 10/2004 | Hunton |
| 2004/0208157 A1 | 10/2004 | Sander et al. |
| 2004/0266366 A1 | 12/2004 | Robinson et al. |
| 2005/0002470 A1 | 1/2005 | Saed et al. |
| 2005/0018765 A1 | 1/2005 | Endres et al. |
| 2005/0059361 A1 | 3/2005 | Shi et al. |
| 2005/0111575 A1 * | 5/2005 | Taler et al. ..................... 375/297 |
| 2005/0116775 A1 * | 6/2005 | McBeath et al. .............. 330/149 |
| 2005/0118965 A1 | 6/2005 | Tanabe et al. |
| 2005/0156662 A1 | 7/2005 | Raghupathy et al. |
| 2005/0157814 A1 * | 7/2005 | Cova et al. ..................... 375/297 |
| 2005/0163251 A1 * | 7/2005 | McCallister ................... 375/296 |
| 2005/0163252 A1 * | 7/2005 | McCallister et al. .......... 375/296 |
| 2005/0195919 A1 * | 9/2005 | Cova ............................. 375/297 |
| 2005/0227646 A1 | 10/2005 | Yamazaki et al. |
| 2006/0008028 A1 * | 1/2006 | Maltsev et al. ................ 375/297 |
| 2006/0050812 A1 * | 3/2006 | Hietala et al. ................. 375/308 |
| 2006/0071711 A1 * | 4/2006 | Persson et al. ................ 330/149 |
| 2006/0178120 A1 | 8/2006 | Puma |
| 2006/0189285 A1 | 8/2006 | Takano et al. |
| 2006/0203899 A1 | 9/2006 | Gee |
| 2006/0258306 A1 | 11/2006 | Balteanu et al. |
| 2006/0280502 A1 | 12/2006 | Sekine et al. |
| 2007/0001756 A1 | 1/2007 | Trocke et al. |
| 2007/0110199 A1 | 5/2007 | Momtaz et al. |
| 2007/0129025 A1 | 6/2007 | Vasa et al. |
| 2007/0133713 A1 * | 6/2007 | Dalipi ........................... 375/297 |
| 2007/0190952 A1 | 8/2007 | Waheed et al. |
| 2008/0219332 A1 | 9/2008 | Brehler |
| 2008/0310617 A1 | 12/2008 | Daecke et al. |
| 2009/0252255 A1 | 10/2009 | Lee et al. |

OTHER PUBLICATIONS

Johnson, Jackie, "Power Amplifier Design for Open Loop EDGE Large Signal Polar Modulation Systems," RFDesign, Jun. 2006, pp. 42-50.

Pinto et al, "Phase Distortion and Error Vector Magnitude for 8-PSK Systems," London Communications Symposium, Sep. 14-15, 2000, University College London, London, England.

Volder, Jack E., "The CORDIC Trigonometric Computing Technique," IRE Trans. On Elect. Computers p. 330, Sep. 1959.

Notice of Allowance for U.S. Appl. No. 10/147,569 mailed Apr. 22, 2010, 4 pages.

Notice of Allowance for U.S. Appl. No. 11/736,176 mailed Apr. 20, 2011, 5 pages.
Final Office Action for U.S. Appl. No. 10/147,569 mailed Mar. 8, 2006, 10 pages.
Supplemental Notice of Allowance for U.S. Appl. No. 10/874,509 mailed Apr. 13, 2009, 2 pages.
Supplemental Notice of Allowance for U.S. Appl. No. 11/847,044 mailed Apr. 24, 2009, 2 pages.
Notice of Allowance for U.S. Appl. No. 11/548,876 mailed Nov. 16, 2009, 8 pages.
Supplemental Notice of Allowance for U.S. Appl. No. 10/147,569 mailed May 5, 2010, 2 pages.
Notice of Allowance for U.S. Appl. No. 10/139,560 mailed Sep. 23, 2004, 7 pages.
Non-final Office Action for U.S. Appl. No. 10/139,560 mailed Jul. 9, 2003, 7 pages.
Non-final Office Action for U.S. Appl. No. 10/147,569 mailed Feb. 21, 2008, 21 pages.
Non-final Office Action for U.S. Appl. No. 10/147,569 mailed May 12, 2009, 42 pages.
Non-final Office Action for U.S. Appl. No. 10/147,569 mailed Sep. 20, 2005, 9 pages.
Final Office Action for U.S. Appl. No. 10/147,569 mailed Feb. 2, 2010, 26 pages.
Final Office Action for U.S. Appl. No. 10/147,569 mailed Mar. 8, 2006, 10 pages.
Final Office Action for U.S. Appl. No. 10/147,569 mailed Sep. 4, 2008, 21 pages.
Non-final Office Action for U.S. Appl. No. 10/147,579 mailed Aug. 17, 2009, 24 pages.
Non-final Office Action for U.S. Appl. No. 10/147,579 mailed Sep. 20, 2005, 10 pages.
Non-final Office Action for U.S. Appl. No. 10/147,579 mailed Oct. 1, 2008, 11 pages.
Non-final Office Action for U.S. Appl. No. 10/147,579 mailed Oct. 30, 2007, 12 pages.
Non-final Office Action for U.S. Appl. No. 10/147,579 mailed Dec. 29, 2006, 13 pages.
Final Office Action for U.S. Appl. No. 10/147,579 mailed Feb. 2, 2010, 14 pages.
Final Office Action for U.S. Appl. No. 10/147,579 mailed Mar. 16, 2006, 11 pages.
Final Office Action for U.S. Appl. No. 10/147,579 mailed Apr. 1, 2009, 13 pages.
Final Office Action for U.S. Appl. No. 10/147,579 mailed Apr. 29, 2008, 17 pages.
Final Office Action for U.S. Appl. No. 10/147,579 mailed May 17, 2007, 17 pages.
Non-final Office Action for U.S. Appl. No. 10/874,509 mailed Aug. 4, 2008, 17 pages.
Non-final Office Action for U.S. Appl. No. 10/874,509 mailed Oct. 17, 2007, 17 pages.
Non-final Office Action for U.S. Appl. No. 11/847,044 mailed Apr. 16, 2008, 9 pages.
Non-final Office Action for U.S. Appl. No. 11/847,044 mailed Dec. 24, 2008, 12 pages.
Notice of Allowance for U.S. Appl. No. 10/859,718 mailed Jun. 14, 2007, 6 pages.
Notice of Allowance for U.S. Appl. No. 11/209,435 mailed Dec. 9, 2008, 6 pages.
Non-final Office Action for U.S. Appl. No. 11/195,379 mailed Jul. 21, 2008, 18 pages.
Final Office Action for U.S. Appl. No. 11/195,379 mailed Jan. 26, 2009, 14 pages.
Notice of Allowance for U.S. Appl. No. 11/347,957 mailed Jun. 25, 2010, 6 pages.
Non-final Office Action for U.S. Appl. No. 11/347,957 mailed Mar. 30, 2009, 21 pages.
Non-final Office Action for U.S. Appl. No. 11/347,957 mailed Dec. 24, 2009, 16 pages.
Notice of Allowance for U.S. Appl. No. 11/392,053 mailed May 26, 2009, 6 pages.
Non-final Office Action for U.S. Appl. No. 11/392,053 mailed Nov. 28, 2008, 9 pages.
Non-final Office Action for U.S. Appl. No. 11/548,876 mailed Mar. 31, 2009, 8 pages.
Non-final Office Action for U.S. Appl. No. 11/736,131 mailed Apr. 1, 2010, 17 pages.
Non-final Office Action for U.S. Appl. No. 11/736,176 mailed Feb. 17, 2011, 23 pages.
Non-final Office Action for U.S. Appl. No. 11/736,176 mailed Sep. 29, 2010, 15 pages.
Advisory Action for U.S. Appl. No. 10/147,569 mailed Nov. 24, 2008, 6 pages.
Advisory Action for U.S. Appl. No. 10/147,569 mailed Jun. 27, 2006, 4 pages.
Cusinato, P. "Gain/bandwidth programmable PA control loop for GSM/GPRS qud-band cellular handsets," IEEE Jounal of Solid-State Circuits, Jun. 2004, pp. 960-966, vol. 39 No. 6.
Notice of Allowance for U.S. Appl. No. 10/147,569 mailed Oct. 21, 2010, 4 pages.
Notice of Allowance for U.S. Appl. No. 10/147,569 mailed Mar. 2, 2011, 5 pages.
Notice of Allowance for U.S. Appl. No. 10/147,569 mailed Jul. 23, 2010, 4 pages.
Notice of Allowance for U.S. Appl. No. 10/147,569 mailed Aug. 31, 2007, 4 pages.
Notice of Allowance for U.S. Appl. No. 10/147,579 mailed Jun. 8, 2010, 4 pages.
Notice of Allowance for U.S. Appl. No. 10/874,509 mailed Dec. 30, 2008, 6 pages.
Notice of Allowance for U.S. Appl. No. 10/874,509 mailed Mar. 31, 2008, 4 pages.
Notice of Allowance for U.S. Appl. No. 11/847,044 mailed Mar. 31, 2009, 4 pages.
Notice of Allowance for U.S. Appl. No. 11/347,957 mailed Oct. 29, 2010, 6 pages.
Notice of Allowance for U.S. Appl. No. 11/347,957 mailed Nov. 26, 2010, 6 pages.

* cited by examiner

METHOD FOR OPTIMIZING AM/AM AND AM/PM PREDISTORTION IN A MOBILE TERMINAL

FIELD OF THE INVENTION

The present invention relates to a polar modulation transmitter, and more specifically to optimizing amplitude modulation to amplitude modulation and amplitude modulation to phase modulation predistortion in a polar transmitter of a mobile terminal.

BACKGROUND OF THE INVENTION

Transmitters form one half of most communication circuits. As such, they assume a position of prominence in design concerns. With the proliferation of mobile terminals, transmitter design has progressed in leaps and bounds as designers try to minimize components and reduce size, battery consumption, and the like. Likewise, modulation schemes are continuously updated to reflect new approaches to maximize information transfers in limited bandwidths. Changes in standards or standards based on newly available spectrum may also cause designers to approach modulating transmitters with different techniques.

Many different standards and modulation schemes exist, but one of the most prevalently used in the world of mobile terminals is the Global System for Mobile Communications (GSM). GSM has many variants, not the least of which is General Packet Radio Service (GPRS). GPRS is a new non-voice value-added service that allows information to be sent and received across a mobile telephone network. It supplements today's Circuit Switched Data and Short Message Service. GSM allows many different types of mobile terminals, such as cellular phones, pagers, wireless modem adapted laptops, and the like, to communicate wirelessly through the Public Land Mobile Network (PLMN) to the Public Switched Telephone Network (PSTN).

One relatively recent change has been the advent of the Enhanced Data for GSM Evolution (EDGE) scheme in GSM systems. This system contains amplitude modulation components, and, as a result, the power amplifier must be linear, never operating in saturation if classical modulation techniques are employed. Such a system lacks the efficiency of one that operates the power amplifier in saturation.

If a polar modulation system is used instead of a classical modulation system, then the power amplifier may operate in saturation and efficiency would be greatly improved. In addition, if the polar signals are generated by a digital method, such a system does not require the use of a high current drain quadrature modulator. Quadrature modulators are undesirable from a design standpoint in that they draw large amounts of current, and hence, drain batteries comparatively fast.

Unfortunately, the amplitude signal that controls the power amplifier will cause unwanted phase components to be created in the output of the power amplifier due to the non-linearities of the power amplifier. This is sometimes called Amplitude Modulation to Phase Modulation (AM/PM) conversion, or AM/PM distortion, and it degrades the Output Radio Frequency Spectrum (ORFS) of the system and the Error Vector Magnitude (EVM). Thus, a need also exists to be able to counteract or eliminate the unwanted AM/PM distortion signal from the transmitted phase signal.

An additional concern is that the power amplifier may have a non-linear gain with varying output power. This may create what is called Amplitude Modulation to Amplitude Modulation (AM/AM) conversion, which is also referred to as AM/AM distortion. The AM/AM distortion may have both phase and amplitude distortion components, and to create a better control system, these should be reduced or eliminated as well.

One method of reducing AM/PM and AM/AM distortion is to provide predistortion of the amplitude and phase path in order to compensate, or substantially cancel, the AM/PM and AM/AM distortion. However, optimization of the predistortion is difficult because the AM/PM and AM/AM distortion can not be easily measured or calculated. Further, AM/AM error, AM/PM error, and misalignment in time between the amplitude and phase paths will appear as degraded EVM and ORFS. Optimization is further complicated because a change in predistortion may improve any one spectrum offset of the ORFS while it degrades other spectrum offsets as well as EVM.

Thus, there remains a need for a system and method for optimizing AM/AM and AM/PM predistortion such that EVM and desired offset frequencies within the ORFS are minimized.

SUMMARY OF THE INVENTION

The present invention provides a method for optimizing predistortion of a polar modulated transmit signal to compensate for Amplitude Modulation to Amplitude Modulation (AM/AM) and Amplitude Modulation to Phase Modulation (AM/PM) distortion of a power amplifier in a mobile terminal in order to optimize an Output Radio Frequency Spectrum (OFRS) of the mobile terminal. The AM/AM and AM/PM predistortion of the polar modulated transmit signal compensates for AM/AM and AM/PM distortion of a power amplifier in the transmit chain of the mobile terminal. In general, the coefficients for polynomials defining the AM/AM and AM/PM predistortion of the polar modulated transmit signal are determined based on optimizing the OFRS of the mobile terminal.

More specifically, for each AM/AM coefficient for the polynomial defining the AM/AM predistortion and each AM/PM coefficient for the polynomial defining the AM/PM predistortion, a first Error Vector Magnitude (EVM) correction is performed to find a value of the coefficient that provides a minimum EVM. Thereafter, values for the AM/AM and AM/PM coefficients that provide a modulation spectrum closest to a desired modulation spectrum are determined by varying the AM/AM and AM/PM coefficients according to one or more predetermined rules. The predetermined rules define ways that the AM/AM and AM/PM coefficients may be varied to adjust the modulation spectrum while keeping EVM substantially fixed.

In one embodiment, the method further includes a second EVM correction for the AM/AM and AM/PM coefficients followed by a fine tuning step. The fine tuning step is similar to the coarse tuning step in that the AM/AM and AM/PM coefficients are varied according to the predetermined rules to find values corresponding to a modulation spectrum closest to the desired modulation spectrum. However, the fine tuning step varies the coefficients over a smaller range with finer resolution.

In one embodiment, the present invention may also optimize the coefficients based on both modulation spectrum and switching spectrum, where the modulation spectrum and the switching spectrum define the ORFS of the mobile terminal. In this embodiment, the coefficients are first optimized for modulation spectrum. Thereafter, the coefficients are further optimized for switching spectrum.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
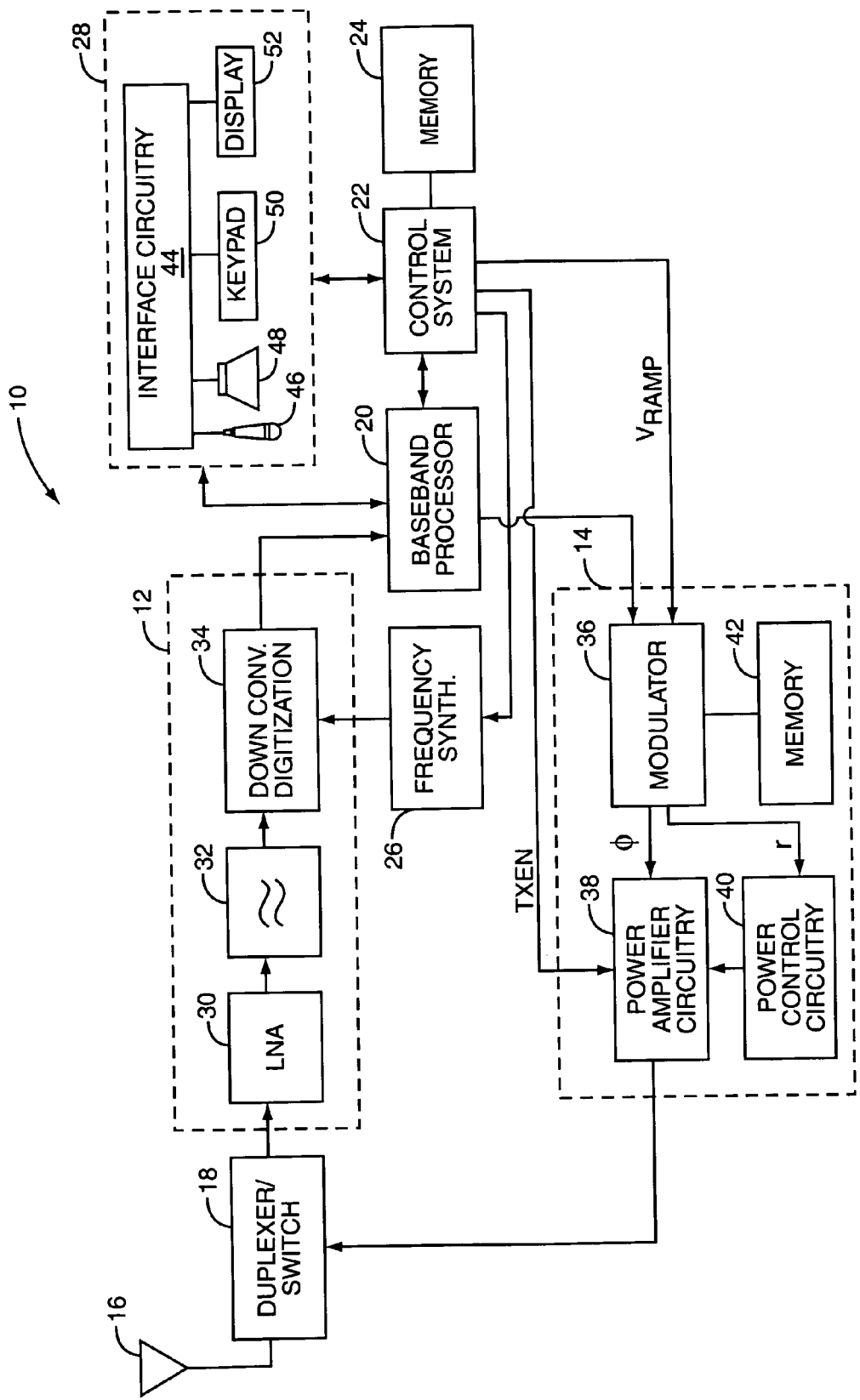
FIG. 1 illustrates an exemplary mobile terminal.

The present invention is preferably incorporated in a mobile terminal 10, such as a mobile telephone, personal digital assistant, wireless Local Area Network (LAN) device, a base station in a mobile network, or the like. The basic architecture of a mobile terminal 10 is represented in FIG. 1, and may include a receiver front end 12, a radio frequency transmitter section 14, an antenna 16, a duplexer or switch 18, a baseband processor 20, a control system 22, memory 24, a frequency synthesizer 26, and an interface 28. The receiver front end 12 receives information bearing radio frequency signals from one or more remote transmitters provided by a base station (not shown). A low noise amplifier 30 amplifies the signal. A filter circuit 32 minimizes broadband interference in the received signal, while a downconverter 34 downconverts the filtered, received signal to an intermediate or baseband frequency signal, which is then digitized into one or more digital streams. The receiver front end 12 typically uses one or more mixing frequencies generated by the frequency synthesizer 26.

The baseband processor 20 processes the digitized, received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The control system 22 may run software stored in the memory 24. Alternatively, the operation of the control system 22 may be a function of sequential logic structures as is well understood. After encoding the data from the control system 22, the baseband processor 20 outputs the encoded data to the radio frequency transmitter section 14.

A modulator 36 receives the data from the baseband processor 20 and operates according to one or more modulation schemes to provide a modulated signal to the power amplifier circuitry 38. In one embodiment, the modulator 36 operates according to an 8-Level Phase Shift Keying (8PSK) modulation scheme, which is a modulation scheme containing both amplitude and phase components. The modulator 36 provides a phase component ($\phi$) at a desired transmit frequency to the power amplifier circuitry 38 and an amplitude component (r) to power control circuitry 40. As described below in detail, one or both of the phase component ($\phi$) and the amplitude component (r) are pre-distorted by the modulator 36. Memory 42 may be used to store coefficients of multiple polynomials used by the modulator 36 for pre-distorting one or both of the phase component ($\phi$) and the amplitude component (r).

The power control circuitry 40 controls an output power of the power amplifier circuitry 38 based on the amplitude component (r) or, optionally, a combination of a ramping signal ($V_{RAMP}$) and the amplitude component (r), thereby providing amplitude modulation of the phase component ($\phi$).

The power amplifier circuitry 38 amplifies the modulated signal from the modulator 36 to a level appropriate for transmission from the antenna 16. A gain of the power amplifier circuitry 38 is controlled by the power control circuitry 40. In essence, the power control circuitry 40 operates to control a supply voltage provided to the power amplifier circuitry 38 based on the amplitude component (r) or, optionally, a combination of the amplitude component (r) and the ramping signal ($V_{RAMP}$) from the modulator 36.

A user may interact with the mobile terminal 10 via the interface 28, which may include interface circuitry 44 associated with a microphone 46, a speaker 48, a keypad 50, and a display 52. The interface circuitry 44 typically includes analog-to-digital converters, digital-to-analog converters, amplifiers, and the like. Additionally, it may include a voice encoder/decoder, in which case it may communicate directly with the baseband processor 20.

The microphone 46 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 48 by the interface circuitry 44. The keypad 50 and display 52 enable the user to interact with the mobile terminal 10, input numbers to be dialed and address book information, or the like, as well as monitor call progress information.

Figure 2:
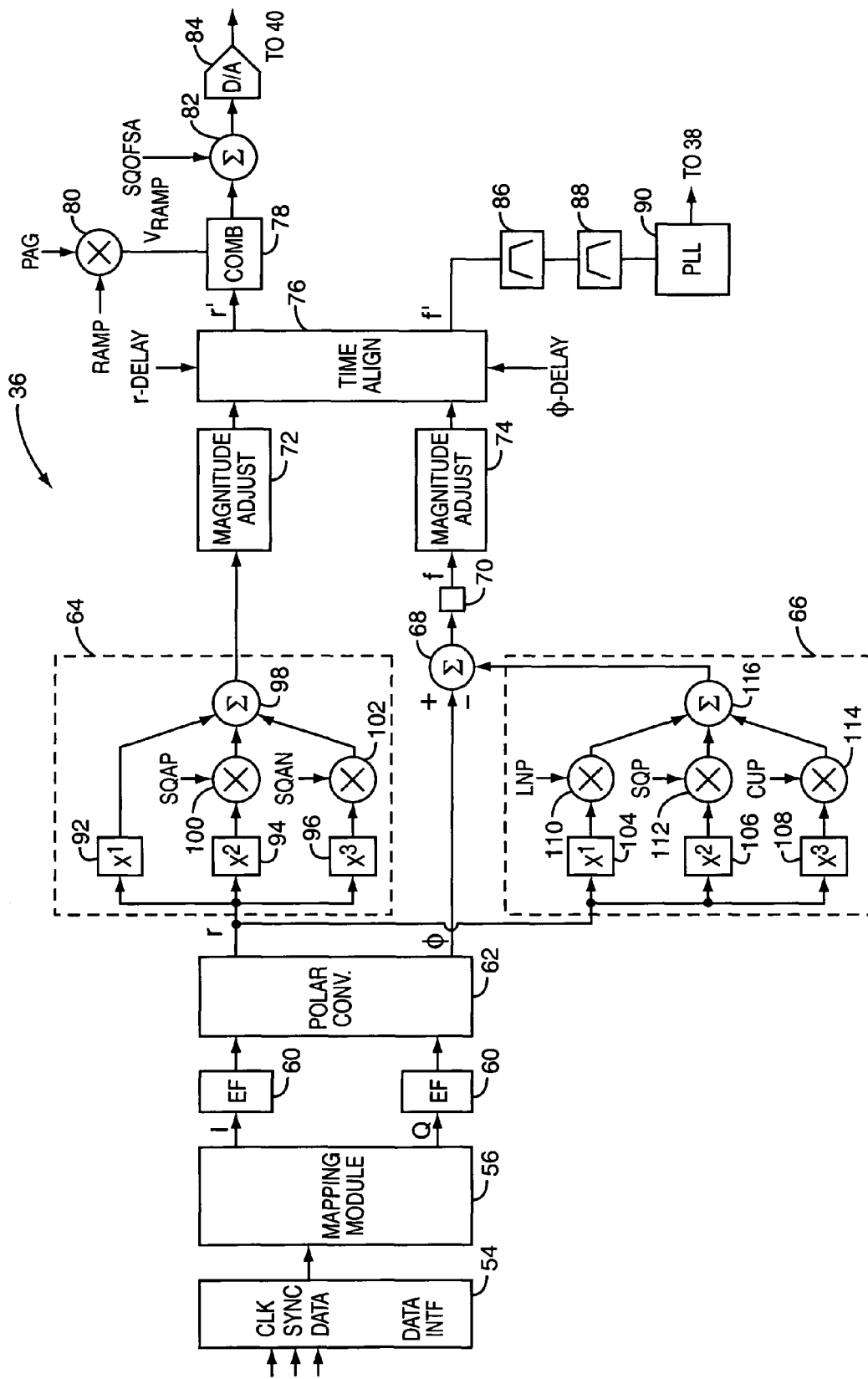
FIG. 2 illustrates an exemplary modulator providing amplitude modulation to amplitude modulation (AM/AM) and amplitude modulation to phase modulation (AM/PM) predistortion when operating according to a polar modulation scheme.

FIG. 2 illustrates an exemplary embodiment of the modulator 36 wherein the modulator 36 operates in according to an 8PSK (8-Level Phase Shift Keying) modulation scheme. It should be noted that 8PSK is an exemplary modulation scheme and is not intended to limit the scope of the present invention. The modulator 36 includes several components, including a data interface 54, a mapping module 56, first and second filters 58, 60, and a polar converter 62. Other components of the modulator 36 will be discussed below. It should be noted that the data interface 54 may include First In First Out (FIFO) circuitry or may alternatively be a real time serial data interface.

The mapping module 56, the filters 58, 60, and the polar converter 62 form an 8PSK modulator. As discussed below, in this embodiment, the 8PSK modulator also includes amplitude modulation to amplitude modulation (AM/AM) compensation circuitry 64, amplitude modulation to phase modulation (AM/PM) compensation circuitry 66, and various other components as described below.

The data interface 54 receives data from the baseband processor 20 (FIG. 1) at the bit rate of the system. This data is passed to the mapping module 56, where the data is grouped into symbols of three consecutive data bits, Grey coded, and rotated by $3\pi/8$ on each symbol as per European Telecommunications Standards Institute (ETSI) specifications. The resulting symbol is mapped to one of sixteen points in an in-phase (I), quadrature phase (Q) constellation.

Both the in-phase (I) and the quadrature phase (Q) components for each point are then filtered by the first and second filters 58, 60, respectively. In an exemplary embodiment, the first and second filters 58, 60 are EDGE finite impulse response (FIR) filters. This, as dictated by the ETSI specifications, shapes the response between symbol times.

After filtering, both the in-phase (I) and the quadrature phase (Q) components are sent to the polar converter 62. The polar converter 62 uses a classical coordinate rotation digital computer (CORDIC) algorithm or like rectangular to polar conversion technique. Thus, the polar converter 62 generates phase ($\phi$) and amplitude (r) equivalent signals. Further information about CORDIC algorithms may be found in *Proceedings of the 1998 ACM/SIGDA Sixth International Symposium On Field Programmable Gate Arrays* by Ray Andraka, Feb. 22-24, pp. 191-200 and "The CORDIC Trigonometric Computing Technique" by Jack E. Volder *IRE Trans on Elect. Computers*, p. 330, 1959, both of which are hereby incorporated by reference in their entireties.

The amplitude signal (r) is split and directed to the AM/AM compensation circuitry 64, and the AM/PM compensation circuitry 66. The AM/AM compensation circuitry 64 introduces a compensation term to the amplitude signal (r) that, after further processing, counteracts the distortion introduced by AM/AM conversion in the power amplifier circuitry 38. The output of the AM/AM compensation circuitry 64 is herein referred to as a compensated amplitude signal. The AM/PM compensation circuitry 66 introduces a compensation signal to the phase signal via subtraction circuitry 68 that, after further processing, counteracts the distortion introduced by AM/PM conversion in the power amplifier circuitry 38. The output of the AM/PM compensation circuitry 66 is herein referred to as a compensated phase signal. Further details of the AM/PM compensation circuitry 62 and the AM/AM compensation circuitry 64 can be found in commonly owned and assigned U.S. Patent Application Publication No. 2003/0215025, entitled AM TO PM CORRECTION SYSTEM FOR POLAR MODULATOR, published Nov. 20, 2003; and U.S. Patent Application Publication No. 2003/025026, entitled AM TO AM CORRECTION SYSTEM FOR POLAR MODULATOR, filed Nov. 20, 2003, both of which are hereby incorporated by reference in their entireties.

The compensated phase signal output from the subtraction circuitry 68 is directed to a phase to frequency converter 70. The output of the phase to frequency converter 70 is a frequency signal (f), which generally corresponds to the desired frequency deviation of the modulated signal. Magnitude adjusters 72, 74 then adjust the magnitude of the compensated amplitude signal and the frequency signal (f), respectively, to a level expected by a time aligner 76, such that they comply with the appropriate standard. Next, a relative time delay is applied as necessary to the signals for best Error Vector Magnitude (EVM) and spectrum by the time aligner 76, such that the time aligner 76 provides the amplitude signal (r') and a frequency signal (f'). The amount by which the time aligner 76 delays the compensated amplitude signal is controlled by one or more amplitude delay signals (r-delay), and the amount by which the time aligner 76 delays the frequency signal (f) is controlled by one or more phase delay signals ($\phi$-delay). The frequency signal (f') is a magnitude adjusted, time aligned version of the output of the phase to frequency converter 70. Because these are preferably digital components, concerns about variations in analog components and the corresponding variation in time delays downstream are minimized.

At this point, the amplitude signal (r') and the frequency signal (f') separate and proceed by different paths, an amplitude signal processing path and a frequency signal processing path, to the power amplifier circuitry 38. With respect to the amplitude signal processing path, the amplitude signal (r') is provided to a combiner 78, which may be a digital multiplier, where the amplitude signal (r') is combined with the ramping signal ($V_{RAMP}$). In this embodiment, the ramping signal ($V_{RAMP}$) is generated by the modulator 36 by combining a predetermined ramp function (RAMP) with a gain signal (PAG). More specifically, a multiplier 80 multiplies the ramp function (RAMP) and the gain signal (PAG) to provide the ramping signal ($V_{RAMP}$). The gain signal (PAG) may be provided by the control system 22 (FIG. 1).

The output of the combiner 78 is provided to summation circuitry 82 where it is combined with an offset term (SQOFSA) to provide a digital power control signal. The summation circuitry 82 may be considered part of the AM/AM compensation circuitry 64, where the offset term (SQOFSA) is part of a polynomial defining the predistortion of the amplitude signal (r). A digital-to-analog (D/A) converter 84 operates to convert the digital power control signal to an analog power control signal, which is provided to the power control circuitry 40 (FIG. 1). The analog power control signal is used by the power control circuitry 40 to set the collector voltage on the power amplifier circuitry 38. As the amplitude signal (r) changes, the voltage at the power amplifier circuitry 38 collector changes, and the output power will vary as $V^2/R_{out}$ ($R_{out}$ is not shown, but is effectively the load on the power amplifier circuitry 38). This is sometimes known as "plate modulation".

The frequency signal (f) from the time aligner 76 is directed to a digital filter 86 and a digital predistortion filter 88. Thereafter, the frequency signal (f), which is a digital signal, is provided to a phase locked loop (PLL) 90 to provide direct digital modulation similarly to that described in commonly owned and assigned U.S. Pat. No. 6,834,084, entitled DIRECT DIGITAL POLAR MODULATOR, issued Dec. 21, 2004, which is incorporated herein by reference in its entirety. In one embodiment, the data interface 54 provides a digital data interface to the baseband processor 20, and the entire phase path from the data interface 54 to the PLL 90 is a digital path.

FIG. 2 also illustrates exemplary embodiments of the AM/AM compensation circuitry 64 and the AM/PM compensation circuitry 66. In general, the AM/AM compensation circuitry 64 operates to provide the compensated amplitude signal based on the amplitude signal (r) provided by the polar converter 62 and an AM/AM compensation polynomial defining the compensated amplitude signal as a function of the amplitude signal (r). In general, the AM/AM compensation polynomial may be defined as:

$$r_{COMP} = SQAN \cdot r^3(t) + SQAP \cdot r^2(t) + r(t) + SQOFSA,$$

where $r_{COMP}(t)$ is the compensated amplitude signal, r(t) is the amplitude signal from the polar converter 62, SQAN is a cubic term coefficient, SQAP is a square term coefficient, and SQOFSA is an offset term. The offset term SQOFSA is implemented by the summation circuitry 82, which may be considered as part of the AM/AM compensation circuitry 64. As described below, the present invention provides a method for optimizing SQAN, SQAP, and SQOFSA. Further, SQAN, SQAP, and SQOFSA may be stored in the memory 42 (FIG. 1).

In order to generate the compensated amplitude signal, the AM/AM compensation circuitry 64 includes linear term generation circuitry 92, square term generation circuitry 94, and cubic term generation circuitry 96. The linear term generation circuitry 92 essentially provides the amplitude signal (r) and may be implemented by directly coupling the amplitude signal (r) from the polar converter 62 to summation circuitry 98. The square term generation circuitry 94 outputs $r^2(t)$, and the cubic term generation circuitry 96 outputs $r^3(t)$. Multiplier 100 multiplies the output of the square term generation circuitry 94 by the square term coefficient SQAP to provide SQAP*$r^2(t)$ to the summation circuitry 98. Multiplier 102 multiples the output of the cubic term generation circuitry 96 by the cubic term coefficient SQAN to provide SQAN*$r^3(t)$ to the summation circuitry 98. Based on these inputs, the summation circuitry 98 provides the compensated amplitude signal. As described below, the offset term SQOFSA is added to the compensated amplitude signal at a later point in the amplitude path. However, in another embodiment, the offset term SQOFSA may be provided to a fourth input port of the summation circuitry 98.

In a similar fashion, the AM/PM compensation circuitry 66 operates to provide a phase compensation signal that is summed with the phase signal (φ) to provide the compensated phase signal. In general, the AM/PM compensation circuitry 66 provides the phase compensation signal based on an AM/PM compensation polynomial defining the phase compensation signal as a function of the amplitude signal (r) from the polar converter 62. The AM/PM compensation polynomial may be defined as:

$$\text{phase\_compensation}(t) = CUP \cdot r^3(t) + SQP \cdot r^2(t) + LNP \cdot r(t),$$

where phase_compensation(t) is the phase compensation signal, r(t) is the amplitude signal from the polar converter 62, CUP is a cubic term coefficient, SQP is a square term coefficient, and LNP is a linear term coefficient. As described below, the present invention provides a method for optimizing CUP, SQP, and LNP. Further, CUP, SQP, and LNP may be stored in the memory 42 (FIG. 1).

In order to generate the phase compensation signal, the AM/PM compensation circuitry 66 includes linear term generation circuitry 104, square term generation circuitry 106, and cubic term generation circuitry 108. The linear term generation circuitry 104 essentially provides the amplitude signal (r) and may be implemented by directly coupling the amplitude signal (r) from the polar converter 62 to the multiplier 110. The square term generation circuitry 106 outputs $r^2(t)$, and the cubic term generation circuitry 108 outputs $r^3(t)$. The multiplier 110 multiplies the output of the linear term generation circuitry 104 by the linear term coefficient LNP to provide LNP*r(t). Multiplier 112 multiplies the output of the square term generation circuitry 106 by the square term coefficient SQP to provide SQP*$r^2(t)$. Multiplier 114 multiples the output of the cubic term generation circuitry 108 by the cubic term coefficient CUP to provide CUP*$r^3(t)$. Summation circuitry 116 operates to sum the outputs of the multipliers 110-114 to provide the phase compensation signal.

The present invention provides a method for optimizing the coefficients SQAN, SQAP, SQOFSA, CUP, SQP, and LNP in order to optimize the modulation spectrum and Error Vector Magnitude (EVM) of the mobile terminal 10. In addition, the coefficients SQAN, SQAP, SQOFSA, CUP, SQP, and LNP may optionally be further optimized in order to further optimize the switching spectrum of the mobile terminal 10. The modulation spectrum and switching spectrum define adjacent channel power (ACP) and are grouped together as Output Radio Frequency Spectrum (ORFS). Modulation spectrum is caused by the modulation process in the radio frequency transmitter section 14. In GSM transmitters, switching spectrum is caused when ramp up for a transmit burst occurs too quickly.

Figure 3:
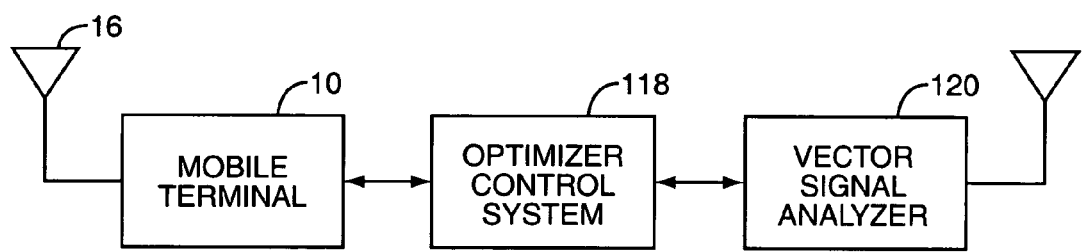
FIG. 3 illustrates an exemplary system for optimizing the AM/AM and AM/PM predistortion of the modulator of FIG. 2 according to one embodiment of the present invention.

FIG. 3 illustrates an exemplary system for optimizing the AM/AM and AM/PM coefficients according to one embodiment of the present invention. More specifically, an optimizer control system 118 communicates with the mobile terminal 10 through a standard interface such as a serial interface, USB, or the like. The optimizer control system 118 communicates with a vector signal analyzer 120, which includes a demodulator of complex signals, determines EVM, and obtains spectrum measurements. In operation, the optimizer control system 118 communicates with the mobile terminal 10 and the vector signal analyzer 120 to optimize the AM/AM and AM/PM coefficients, as discussed below.

Figure 4:
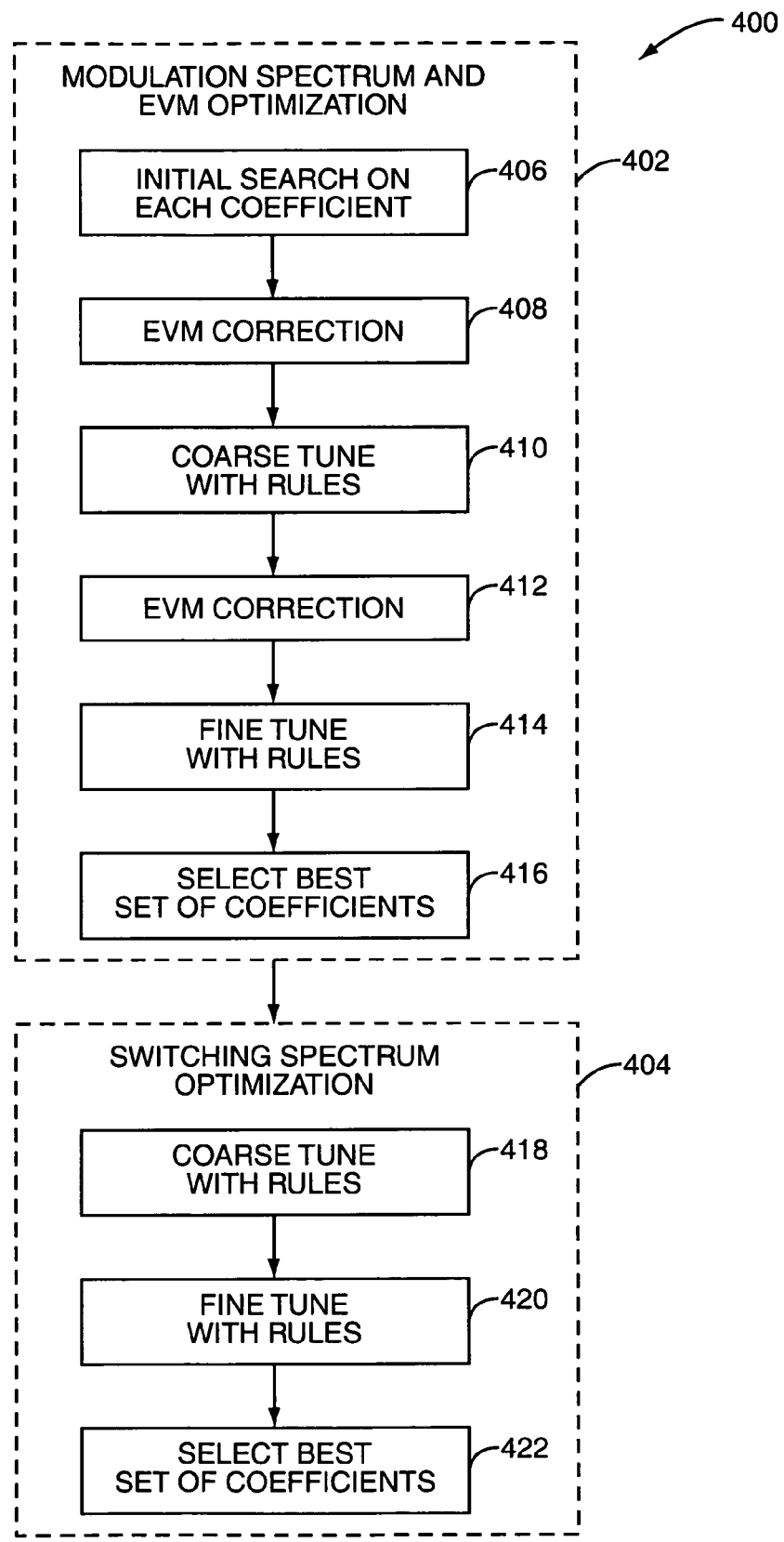
FIG. 4 illustrates an exemplary method for optimizing the AM/AM and AM/PM predistortion of the modulator of FIG. 2 according to one embodiment of the present invention.

FIG. 4 illustrates a method 400 for optimizing the coefficients SQAN, SQAP, SQOFSA, CUP, SQP, and LNP in order to optimize the modulation spectrum and EVM (step 402) and, optionally, the switching spectrum (step 404) of the mobile terminal 10. The method 400 is repeated for each power control level (PCL) for each sub-band of each frequency band of interest. Thus, for GSM having four frequency bands (GSM 850, EGSM 900, GSM 1800, GSM 1900) with each frequency band having three sub-bands and N PCLs, the method 400 may be repeated 12*N times.

Optimization of the modulation spectrum and EVM of the mobile terminal begins by performing an initial search on each of the coefficients SQAN, SQAP, SQOFSA, CUP, SQP, and LNP to find a best modulation spectrum (step 406). As described below in more detail, the best modulation spectrum is determined by systematically varying each of the coefficients SQAN, SQAP, SQOFSA, CUP, SQP, and LNP until a best modulation spectrum is found. For example, each of the coefficients SQAN, SQAP, SQOFSA, CUP, SQP, and LNP may first be set to a default value. Then, SQOFSA may first be varied to find a value for SQOFSA corresponding to a best modulation spectrum. More specifically, SQOFSA is systematically varied. Each time SQOFSA is varied, measurements of the output modulation spectrum of the mobile terminal 10 are made at predetermined points such as, but not limited to, +/−400 kHz, +/−600 kHz, and possibly +/−800 kHz offsets. Using a predetermined weighted equation, the measurements are combined into a modulation spectrum weight. Using, the modulation spectrum weights, SQOFSA is varied to achieve a best modulation spectrum weight. For example, the value of SQOFSA that provides the lowest modulation spectrum weight may be selected as providing the best modulation spectrum. In a similar fashion, SQAN, SQAP, SQOFSA, CUP, SQP, and LNP are varied to find values for each of these coefficients that provide the best output modulation spectrum. Once the initial search step 406 is complete, a first set of values for the coefficients SQAN, SQAP, SQOFSA, CUP, SQP, and LNP is stored in memory such as the memory 42 (FIG. 1) or memory associated with the optimizer control system 118 (FIG. 3).

The initial search step 406 may optionally include an initial search for the amplitude delay (r-delay) and phase delay (φ-delay) values providing the best modulation spectrum. The amplitude delay (r-delay) and phase delay (φ-delay) may be systematically varied to find values for the amplitude delay (r-delay) and phase delay (φ-delay) that provide the best modulation spectrum. The best modulation spectrum may be determined by making measurements of the output modulation spectrum at predetermined points such as, but not limited to, +/−400 kHz and +/−600 kHz. Using a predetermined weighted equation, the measurements are combined into a modulation spectrum weight. Then, for example, the values of the amplitude delay (r-delay) and phase delay (φ-delay) that provide the lowest modulation spectrum weight are selected as providing the best modulation spectrum.

Next, EVM correction is performed (step 408). In this step, the coefficients SQAN, SQAP, CUP, SQP, and LNP are systematically varied to find the minimum EVM. Initially, the coefficients SQAN, SQAP, CUP, SQP, and LNP are set equal to the first set of values determined during the initial search step 406. From these initial values, the coefficients SQAN, SQAP, CUP, SQP, and LNP are varied to minimize EVM. More specifically, CUP may first be varied to find a value for CUP corresponding to a minimum EVM measurement. Each time CUP is varied, a measurement of EVM is made. CUP is varied to find the value for CUP providing the lowest, or minimum, EVM measurement. In a similar fashion, SQP, LNP, SQAN, and SQAP are then varied to find values for SQP, LNP, SQAN, and SQAP providing minimum EVM measurements. Once the EVM correction step 408 is complete, a second set of values for the coefficients SQAN, SQAP, SQOFSA, CUP, SQP, and LNP is stored in memory such as the memory 42 (FIG. 1). It should be noted that each time the AM/AM coefficients are varied, the output power of the mobile terminal 10 may be corrected to be substantially equal to the target output power. For example, each time the AM/AM coefficients are varied, the output power of the mobile terminal 10 may be corrected to within 0.2 dB of the target output power.

Next, coarse tuning of the coefficients SQAN, SQAP, SQOFSA, CUP, SQP, and LNP is performed according to one or more predetermined rules that define how the coefficients SQAN, SQAP, SQOFSA, CUP, SQP, and LNP may be varied to change the modulation spectrum while keeping EVM substantially fixed (step 410). For example, one of the predetermined rules may be to increment CUP and LNP by a multiple of four and decrement SQP by a multiple of 4 (or vice versa). Thus, since the EVM correction step 408 optimizes the coefficients SQAN, SQAP, SQOFSA, CUP, SQP, and LNP for EVM and the predetermined rules keep EVM substantially fixed, the search for values for the coefficients SQAN, SQAP, SQOFSA, CUP, SQP, and LNP is reduced from a two dimensional search for optimizing both the modulation spectrum and EVM to a one dimensional search for optimizing the modulation spectrum.

During the coarse tuning step 410, the coefficients SQAN, SQAP, SQOFSA, CUP, SQP, and LNP are systematically varied to find values that provide the best modulation spectrum. More specifically, a series of steps are performed, where for each step one or more of the coefficients are varied according to one of the predetermined rules to vary the modulation spectrum while keeping EVM substantially the same. For each of the series of steps, the coefficients are varied according to the predetermined rule for that step. Each time the coefficients are varied, measurements of the modulation spectrum are made, and a weighted equation is used to calculate a modulation spectrum weight. Based on the modulation spectrum weight, the coefficients are varied according to the predetermined rule to find values for the coefficients corresponding to the best modulation spectrum. As an example, the best modulation spectrum may correspond to the lowest, or minimum, modulation spectrum weight. Each of the series of steps during the coarse tuning step 410 produces a set of values for the coefficients SQAN, SQAP, SQOFSA, CUP, SQP, and LNP and stores the set of values for the coefficients in memory, such as the memory 42 (FIG. 1).

After the coarse tuning step 410, a second EVM correction step 412 is performed. The second EVM correction step 412 is similar to the EVM correction step 408. However, the second EVM correction step 412 may vary the coefficients SQAN, SQAP, CUP, and SQP over a smaller range of values than in the EVM correction step 408. More specifically, the coefficients SQAN, SQAP, CUP, and SQP are systematically varied to find the minimum EVM. The coefficient LNP may also be varied in this step if desired. Initially, the coefficients SQAN, SQAP, CUP, and SQP are set equal to the values determined in the previous step. From these values, the coefficients SQAN, SQAP, CUP, and SQP are varied to minimize EVM. More specifically, CUP may first be varied to find a value for CUP corresponding to a minimum EVM measurement. Each time CUP is varied, an EVM measurement is made. CUP is varied to find the value for CUP providing the lowest, or minimum, EVM measurement. In a similar fashion, SQP, SQAN, and SQAP are then varied to find values for SQP, SQAN, and SOAP providing minimum EVM measurements. Once the EVM correction step 408 is complete, a set of values for the coefficients SQAN, SQAP, SQOFSA, CUP, SQP, and LNP is stored in memory such as the memory 42 (FIG. 1).

Next, a fine tuning step is performed according to the one or more predetermined rules that define how the coefficients SQAN, SQAP, SQOFSA, CUP, SQP, and LNP may be varied to change the modulation spectrum while keeping EVM substantially fixed (step 414). This step is similar to the coarse tuning step 410. However, in the fine tuning step 414, the coefficients SQAN, SQAP, SQOFSA, CUP, SQP, and LNP are varied over smaller ranges than in the coarse tuning step 410. As with the coarse tuning step 410, the fine tuning step 414 includes a series of steps, each varying one or more of the coefficients SQAN, SQAP, SQOFSA, CUP, SQP, and LNP according to one of the predetermined rules to find the values that provide the best modulation spectrum. Each of the series of steps during the fine tuning step 414 provides a set of values for the coefficients that is stored in memory.

The final step is to select a best set of values for the coefficients from the numerous sets of values for the coefficients determined during steps 406-414 and stored in memory (step 416). The best set of coefficients may be selected based on predetermined criteria such as: (1) EVM<=a minimum EVM found in all searches+a predetermined tolerance, (2) EVM<=a predetermined maximum value; and (3) best worst-case 400 kHz margin. These criteria are exemplary. Other criteria may be used depending on the particular implementation.

After the coefficients SQAN, SQAP, SQOFSA, CUP, SQP, and LNP are optimized for modulation spectrum and EVM optimization in steps 406-416, the method 400 may optionally proceed to the switching spectrum optimization step 404. The switching spectrum optimization step 404 begins by coarse tuning the values of the coefficients SQAN, SQAP, SQOFSA, CUP, SQP, and LNP determined in the modulation spectrum and EVM optimization step 402 (step 418). The coarse tuning step 418 is similar to the coarse tuning step 410. However, in the coarse tuning step 418, the coefficients SQAN, SQAP, SQOFSA, CUP, SQP, and LNP are systematically varied according to the one or more predetermined rules to find values for the coefficients SQAN, SQAP, SQOFSA, CUP, SQP, and LNP that provide the best switching spectrum.

Next, a fine tuning process is performed where the coefficients SQAN, SQAP, SQOFSA, CUP, SQP, and LNP are varied according to the predetermined rules (step 420). The fine tuning step 420 differs from the coarse tuning step in that the coefficients SQAN, SQAP, SQOFSA, CUP, SQP, and LNP are varied across a smaller range of values.

Lastly, the best set of values for the coefficients SQAN, SQAP, SQOFSA, CUP, SQP, and LNP are selected from the sets of values for the coefficients SQAN, SQAP, SQOFSA, CUP, SQP, and LNP stored during the coarse and fine tuning steps 418 and 420 based on predetermined criteria (step 422). In one embodiment, the predetermined criteria is best worst-case 400 kHz switching spectrum from all searches.

Steps 406-416 are repeated to determine values for the coefficients SQAN, SQAP, SQOFSA, CUP, SQP, and LNP that optimize the modulation spectrum and EVM for each desired PCL, sub-band, and frequency band combination. Optionally, steps 418-422 may additionally be performed to further optimize the coefficients SQAN, SQAP, SQOFSA, CUP, SQP, and LNP for switching spectrum optimization.

Figure 5A:
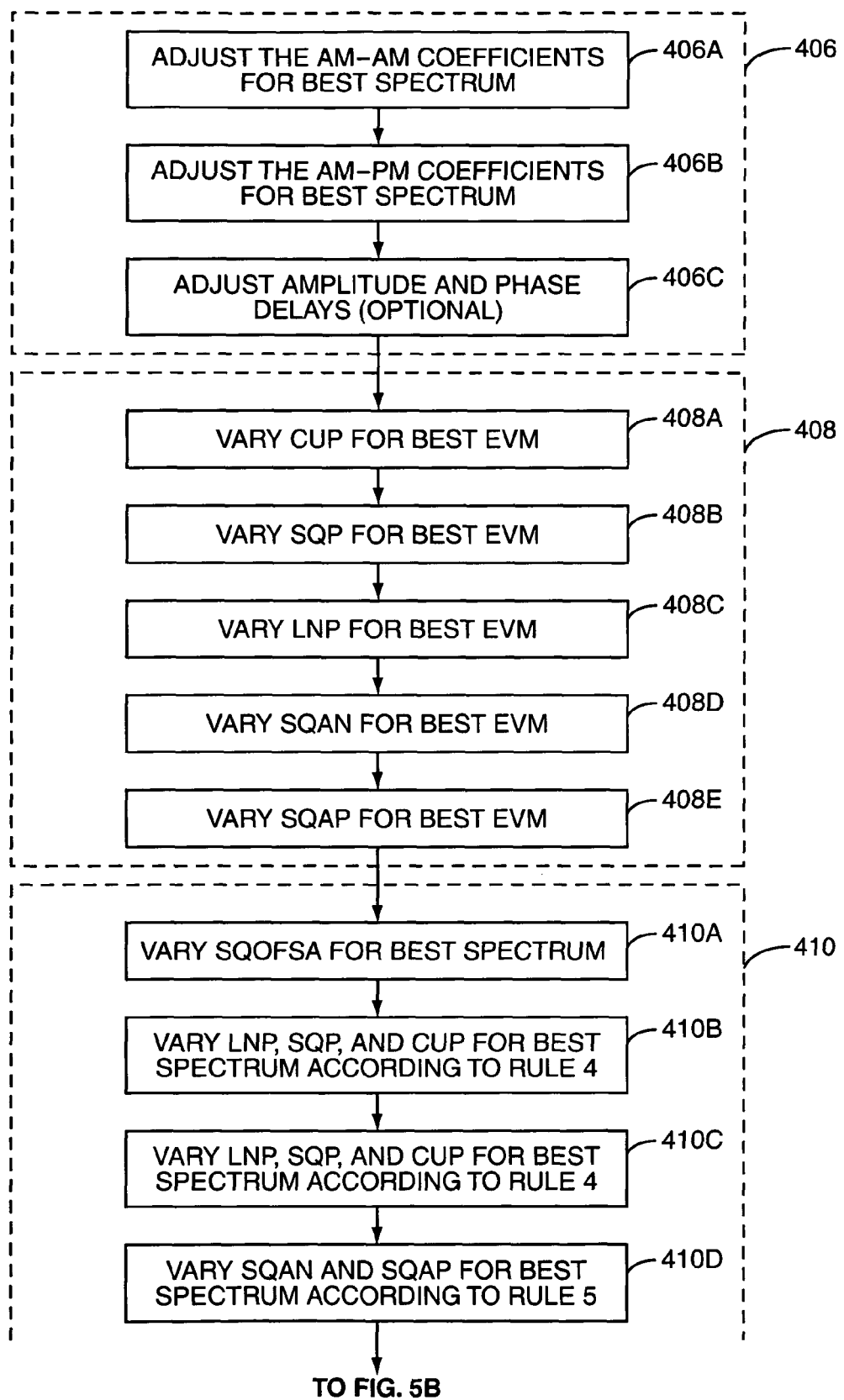
FIGS. 5A-5C provide a more detailed illustration of the method of FIG. 4 according to an exemplary embodiment of the present invention.
Figure 5B:
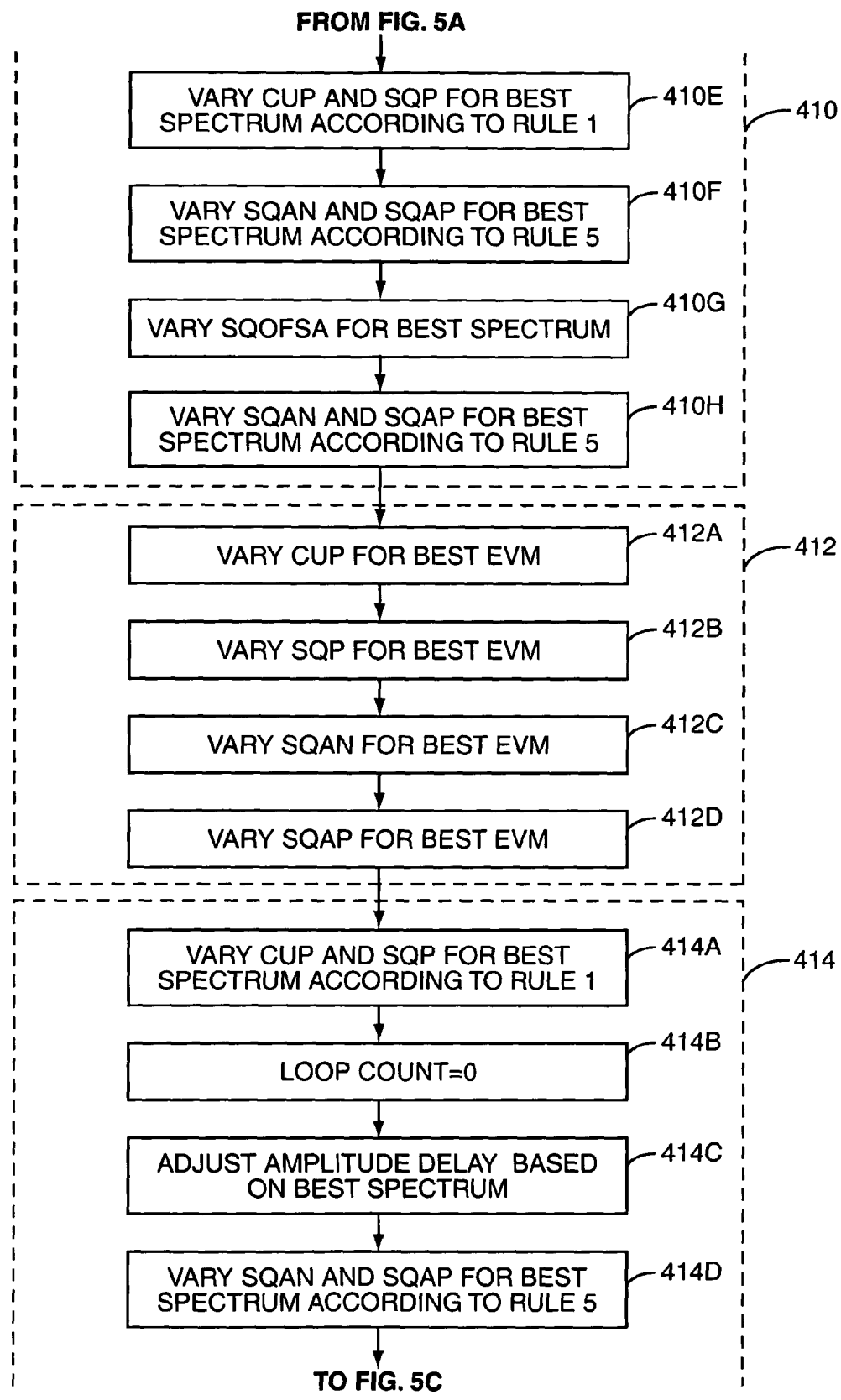
Figure 5C:
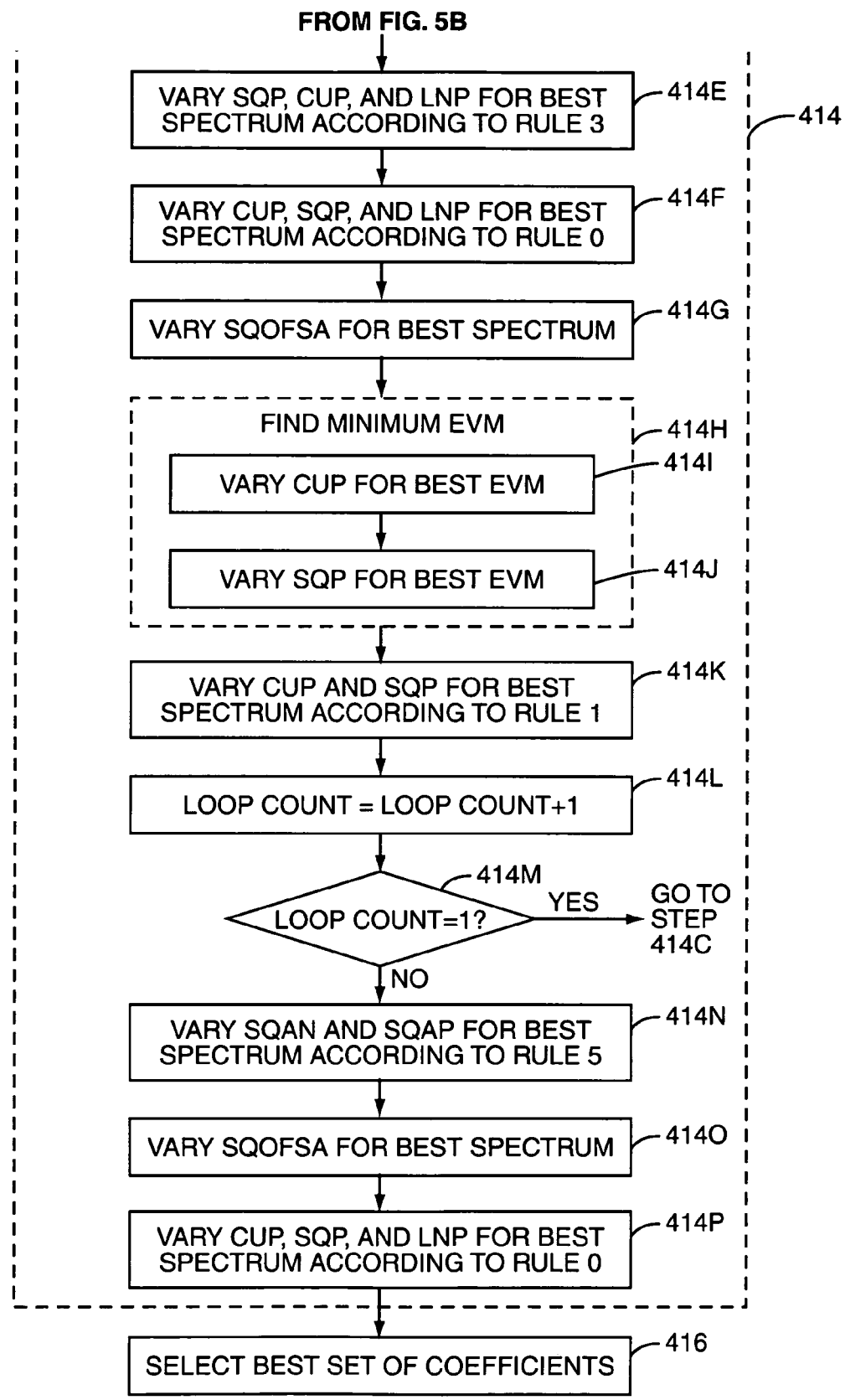

FIGS. 5A-5C are a more detailed illustration of the optimization of the modulation spectrum and EVM step 402 of FIG. 4 according to an exemplary embodiment of the present invention. FIGS. 5A-5C are hereafter generally referred to as FIG. 5. For this example, the predetermined rules for varying the modulation spectrum while keeping EVM substantially fixed are:

Rule 0: CUP=CUP+4, SQP=SQP−4, and LNP=LNP+4;
Rule 1: CUP=CUP+4 and SQP=SQP−3;
Rule 2: SQP=SQP+1 and LNP=LNP−4;
Rule 3: SQP=SQP+8, CUP=CUP−4, and LNP=LNP−16; and
Rule 4: LNP=LNP+16, CUP=CUP−4, and SQP=SQP−1.

These rules may be multiplied by a multiplier to adjust the rules for either coarse tuning or fine tuning. For example, Rule 0 may be multiplied by a multiplier of 2 to obtain: CUP=CUP+8, SQP=SQP−8, and LNP=LNP+8.

The weighted equations used to generate the modulation spectrum weights may, for example, be defined as:

$$\text{SpectrumWeight}=1.8*(Lo400+Hi400-2*ETSI400((Band,PCL)))+0.5*(Lo400-Hi400)^2+1.5*(Lo600+Hi600-2*ETSI600((Band,PCL)))+0.5*(Lo600-Hi600)^2 \quad \text{EQN 0}$$

$$\text{SpectrumWeight}=1*(Lo400+Hi400-2*ETSI400((Band,PCL)))+0.4*(Lo400-Hi400)^2+2*(Lo600+Hi600-2*ETSI600((Band,PCL)))+1*(Max600-ETSI600((Band,PCL)))+1.5*(Lo600-Hi600)^2 \quad \text{EQN 1}$$

$$\text{SpectrumWeight}=1.5*(Lo400+Hi400-2*ETSI400((Band,PCL)))+2*(Max400-ETSI400((Band,PCL)))+0.5*(Lo400-Hi400)^2+1*(Lo600+Hi600-2*ETSI600((Band,PCL)))+1.5*(Max600-ETSI600((Band,PCL)))+0.5*(Lo600-Hi600)^2+0.1*(Lo800+Hi800-2*ETSI800((Band,PCL)))+0.1*(Lo800-Hi800)^2 \quad \text{EQN 2}$$

$$\text{SpectrumWeight}=1.5*(Lo400+Hi400-2*ETSI400((Band,PCL)))+1.5*(Max400-ETSI400((Band,PCL)))+0.5*(Lo400-Hi400)^2+1.8*(Lo600+Hi600-2*ETSI600((Band,PCL)))+0.5*(Lo600-Hi600)^2 \quad \text{EQN 3}$$

$$\text{SpectrumWeight}=1*(Lo400+Hi400-2*ETSI400((Band,PCL)))+0.5*(Max400-ETSI400((Band,PCL)))+0.8*(Lo400-Hi400)^2+1*(Max68)+0.8*(Lo600-Hi600)^2, \text{ where}$$

$$Max68=Max6800-ETSI600((Band,PCL)), \text{ and}$$

If Max68>−1 Then $$Max68=Max68*2 \quad \text{EQN 4}$$

End If $$\text{SpectrumWeight}=2*(Max400-ETSI400((Band,PCL)))+(Max600-ETSI600((Band,PCL))) \quad \text{EQN 5}$$

$$\text{SpectrumWeight}=1.5*(Lo400+Hi400-2*ETSI400((Band,PCL)))+1.5*(Max400-ETSI400((Band,PCL)))+0.9*(Lo400-Hi400)^2+2*(Lo600+Hi600-2*ETSI600((Band,PCL)))+1*(Lo600-Hi600)^2 \quad \text{EQN 6}$$

$$\text{SpectrumWeight}=1.8*(Max400-ETSI400((Band,PCL)))+0.5*(Lo400-Hi400)^2+1.5*(Max600-ETSI600((Band,PCL)))+0.5*(Lo600-Hi600)^2 \quad \text{EQN 7}$$

$$\text{SpectrumWeight}=4*(Max400-ETSI400((Band,PCL)))+0.5*$$

$$(Max600-ETSI600((Band,PCL)))+Maxmult, \text{ where}$$

Maxmult=0

$$Max68=Max6800-ETSI600(Band,PCL)$$

If Max68>−2 Then $$Maxmult=100 \quad \text{EQN 8}$$

End If

Lo400 is the modulation spectrum measurement at −400 kHz; Hi400 is the modulation spectrum measurement at +400 kHz; and ETSI400(Band, PCL) is the modulation spectrum value specified by ETSI for +/−400 kHz for the given frequency band and PCL. Lo600 is the modulation spectrum measurement at −600 kHz; Hi600 is the modulation spectrum measurement at +600 kHz; and ETSI600(Band, PCL) is the modulation spectrum value specified by ETSI for +/−600 kHz for the given frequency band and PCL. Lo800 is the modulation spectrum measurement at −800 kHz; Hi800 is the modulation spectrum measurement at +800 kHz; and ETSI800 (Band, PCL) is the modulation spectrum value specified by ETSI for +/−800 kHz for the given frequency band and PCL. Max400 is the larger of Lo400 and Hi400, and Max600 is the larger of Lo600 and Hi600. Max68 and Max6800 are the same and represent the highest value of Hi600, Lo600, Hi800, and Hi800. Maxmult is a term that adds a weight of 100 if Max600 is failing, 50 if Max600 is passing specification by less than 1 dB, 10 if Max600 is passing specification by less than 2 dB, and 0 if Max600 has greater than 2 dB of margin to the specification.

Each of the exemplary weighting equations above focuses on particular problem areas in the modulation spectrum. For example, equation 0 looks at both +/−400 kHz and +/−600 kHz, but places a slightly greater weight on the +/−400 kHz measurements. In contrast, equation 1 places greater weight on the +/−600 kHz measurements. Equation 2 is similar to equations 0 and 1 but additionally includes terms for +/−800 kHz modulation spectrum measurements. In a similar fashion, equations 3-8 focus on different problem areas in the modulation spectrum.

Referring again to FIG. 5, optimization of the modulation spectrum and EVM begins by performing the initial search step 406. In this embodiment, the initial search step 406 begins by adjusting the AM/AM coefficients SQAN, SQAP, and SQOFSA to find the best modulation spectrum (step 406A). More particularly, SQOFSA may first be varied to find a best modulation spectrum. For example, SQOFSA may be a binary value having 512 possible settings. In this case, a binary search may be performed by setting SQOFSA to a predetermined initial value and varying SQOFSA by +/−64, +/−32, +/−16, +/−8, +/−4, +/−2, and +/−1 to follow the binary search tree and find the value for SQOFSA corresponding to the best modulation spectrum. Each time SQOFSA is varied, measurements of the modulation spectrum are made. Then, using a desired one of the weighting equations, a spectrum weight is determined. For this example, the desired weighting equation is equation 0.

In operation, the spectrum weight is first determined for the initial value of SQOFSA, and for the initial value of SQOFSA+/−64. One of these values, such as the value corresponding to the lowest spectrum weight, is selected as the best value based on the spectrum weights. Then, measurements are made and spectrum weights are determined for the previous best value +/−32, and the binary search continues until the value of SQOFSA corresponding to the best modulation spectrum is found.

In a similar fashion, a binary search is made to find the value of SQAN corresponding to the best modulation spectrum. Then, a binary search is made to find the value of SQAP corresponding to the best modulation spectrum.

Next, the AM/PM coefficients CUP, SQP, and LNP are adjusted to find the best modulation spectrum (step 406B). For example, CUP, SQP, and LNP may each be a binary number having 512 possible settings. LNP may first be adjusted by performing a binary search starting at an initial value of LNP+/−128, then following the binary tree (+/−64, +/−32, +/−16, etc.) to find the value of LNP corresponding to the best modulation spectrum. As discussed above, the best modulation spectrum is determined by measuring the modulation spectrum for each variation of LNP, and calculating a spectrum weight based on the measurements of the modulation spectrum and a desired one of the weighting equations. In a similar fashion, SQP and CUP may be adjusted by performing binary searches for values of SQP and CUP providing the best modulation spectrum. In one embodiment, step 406B uses equation 0 from above to calculate the spectrum weights for each variation of LNP during the binary search.

Optionally, the initial search step 406 may include adjusting the amplitude and phase delays (r-delay, φ-delay) to find values for each of the delays providing the best modulation spectrum (step 406C). This may be done by performing binary searches for each of the delays and determining the values corresponding to the best modulation spectrum based on, for example, the weighting equation EQN1.

The EVM correction step 408 includes varying CUP by +/−32, +/−16, +/−8, +/−4, +/−2, +/−1 to perform a binary search for the value of CUP providing a best, or minimum, EVM (step 408A). The initial value of CUP is the value of CUP determined in step 406B. SQP is then varied from the value determined in step 406B by +/−16, +/−8, +/−4, +/−2, +/−1 to perform a binary search for the value of SQP providing the best, or minimum, EVM (step 408B). LNP is then varied from the value determined in step 406B by +/−16, +/−8, +/−4, +/−2, +/−1 to perform a binary search for the value of LNP providing the best, or minimum, EVM (step 408C).

Similarly, SQAN is varied from the value determined in step 406A by +/−32, +/−16, +/−8, +/−4, +/−2, +/−1 to perform a binary search for the value of SQAN providing the best, or minimum, EVM (step 408D), and SQAP is varied from the value determined in step 406A by +/−16, +/−8, +/−4, +/−2, +/−1 to perform a binary search for the value of SQAP providing the best, or minimum, EVM (step 408E). It should be noted that each time either SQAN, SQAP, or SQOFSA is varied, the output power of the mobile terminal 10 is corrected to within 0.2 dB of the ETSI specified output power for the particular power control level before measurements of the modulation spectrum are made. This may be accomplished, for example, by adjusting the value of the power amplifier gain (PAG) (FIG. 2).

The coarse tuning step 410 starts by varying SQOFSA to find a value of SQOFSA providing the best modulation spectrum (step 410A). For example, a binary search may be performed by varying SQOFSA from the value determined in step 406A by +/−32, +/−16, +/−8, +/−4, +/−2, +/−1 following the binary tree to the value of SQOFSA providing the best modulation spectrum. Next, LNP, SQP, and CUP are varied according to Rule 4 to find the values of LNP, SQP, and CUP providing the best modulation spectrum (step 410B). As discussed above, Rule 4 is a predetermined rule that allows the modulation spectrum to vary while keeping EVM substantially fixed. In one embodiment, a multiplier of +/−4 is used to begin a binary search tree to find the values of LNP, SQP, and CUP that provide the best modulation spectrum.

Step 410C varies LNP, SQP, and CUP according to Rule 3 to perform a binary search for the values of LNP, SQP, and CUP providing the best modulation spectrum. In one embodiment, a multiplier of +/−4 is used to begin the binary search. Then, step 410D varies SQAN and SQAP according to Rule 5 to perform a binary search for the values of SQAN and SQAP providing the best modulation spectrum. In one embodiment, a multiplier of +/−4 is used to begin a binary search tree. Step 410E (FIG. 5B) then varies CUP and SQP according to Rule 1 to perform a binary search for the values of CUP and SQP providing the best modulation spectrum. In one embodiment, a multiplier of +/−4 is used to begin a binary search tree. Step 410F varies SQAN and SQAP according to Rule 5 to perform a binary search for the values of SQAN and SQAP providing the best modulation spectrum. In one embodiment, a multiplier of +/−4 is used to begin a binary search tree. Step 410G varies SQOFSA to perform a binary search for the value of SQOFSA providing the best modulation spectrum. In one embodiment, the binary search tree is started using +/−64. Finally, step 410H again varies SQAN and SQAP according to Rule 5 to perform a binary search for the values of SQAN and SQAP providing the best modulation spectrum. In one embodiment, a multiplier of +/−2 is used to begin a binary search tree.

The second EVM correction step 412 is similar to the EVM correction step 408 described above. In general, step 412A varies CUP to find the value for CUP providing the best, or minimum, EVM. A value of +/−4 may be used to start the binary search tree. Step 412B varies SQP to find the value for SQP providing the best, or minimum, EVM. A value of +/−2 may be used to start the binary search tree. Step 412C varies SQAN to find the value for SQAN providing the best, or minimum, EVM. A value of +/−2 may be used to start the binary search tree. Step 412D varies SQAP to find the value for SQAP providing the best, or minimum, EVM. A value of +/−2 may be used to start the binary search tree.

As illustrated, the fine tuning step 414 includes a number of steps 414A-414P. Step 414A varies CUP and SQP according to Rule 1 to perform a binary search for values of CUP and SQP providing the best modulation spectrum. In one embodiment, a multiplier of +/−2 is used to begin the binary search tree. Step 414B sets a loop count value to zero. As will become apparent below, the loop count value is used to control the number of iterations of steps 414C-414K.

Step 414C varies the amplitude delay (r-delay) to perform a binary search for the value of the amplitude delay (r-delay) providing the best modulation spectrum. Step 414D varies SQAN and SQAP according to Rule 5 to perform a binary search for values of SQAN and SQAP providing the best modulation spectrum. In one embodiment, a multiplier of +/−2 is used to begin the binary search tree. Step 414E varies SQP, CUP, and LNP according to Rule 3 to perform a binary search for values of SQP, CUP, and LNP providing the best modulation spectrum. In one embodiment, a multiplier of +/−1 is used to begin the binary search tree. Step 414F varies CUP, SQP, and LNP according to Rule 0 to perform a binary search for values of SQP, CUP, and LNP providing the best modulation spectrum. Step 414G varies SQOFSA to perform a binary search for a value of SQOFSA providing the best modulation spectrum. In one embodiment, a multiplier of +/−32 is used to begin the binary search tree.

Step 414H varies CUP and SQP to find values corresponding to a minimum EVM. More particularly, step 414I varies CUP to perform a binary search for a value of CUP that provides a minimum EVM. In one embodiment, a value of +/−2 is used to start the binary search tree. Step 414J varies SQP to perform a binary search for a value of SQP that provides a minimum EVM. In one embodiment, a value of +/−1 is used to start the binary search tree.

Step 414K varies CUP and SQP according to Rule 1 to perform a binary search for values of CUP and SQP providing the best modulation spectrum. In one embodiment, a multiplier of +/−4 is used to begin the binary search tree. Step 414L increases the loop count by one. If the loop count is equal to one, then steps 414C-414K are repeated (step 418M). Note, however, that steps 414C-414K may be performed only once or may be performed any number of times as needed or desired.

If the loop count is not equal to one, the process proceeds to step 414N. Step 414N varies SQAN and SQAP according to Rule 5 to perform a binary search for values of SQAN and SQAP providing the best modulation spectrum. In one embodiment, a multiplier of +/−2 is used to begin the binary search tree. Step 414O varies SQOFSA to perform a binary search for a value of SQOFSA providing the best modulation spectrum. In one embodiment, a multiplier of +/−8 is used to begin the binary search tree. Step 414P varies SQP, CUP, and LNP according to Rule 0 to perform a binary search for values of SQP, CUP, and LNP providing the best modulation spectrum. In one embodiment, a multiplier of +/−4 is used to begin the binary search tree.

Lastly, a best set of values for the coefficients SQAN, SQAP, SQOFSA, CUP, SQP, and LNP is selected from the sets of values determined in steps 406A-414P based on predetermined criteria (step 416). More specifically, each of the steps 406A-414P generates a set of values for either the AM/AM or AM/PM coefficients. As discussed above, a best set of AM/AM and AM/PM coefficients are selected based on predetermined criteria.

Those skilled in the art will recognize improvements and modifications to the preferred embodiments of the present invention. All such improvements and modifications are considered within the scope of the concepts disclosed herein and the claims that follow.

What is claimed is:

1. A method of optimizing coefficients for polynomials defining Amplitude Modulation to Amplitude Modulation (AM/AM) and Amplitude Modulation to Phase Modulation (AM/PM) predistortion for a polar modulated transmit signal in a mobile terminal in order to optimize an Output Radio Frequency Spectrum (OFRS) of the mobile terminal, wherein the AM/AM and AM/PM predistortion compensates for AM/AM and AM/PM distortion of a power amplifier in a transmit chain of the mobile terminal, comprising:

for each AM/AM coefficient for the polynomial defining the AM/AM predistortion and each AM/PM coefficient for the polynomial defining the AM/PM predistortion, performing a first Error Vector Magnitude (EVM) correction to find a value of the coefficient that provides a minimum EVM;

determining values for the AM/AM and AM/PM coefficients to optimize a modulation spectrum of the mobile terminal by varying the AM/AM and AM/PM coefficients according to at least one predetermined rule defining a manner by which the AM/AM and AM/PM coefficients are varied to adjust the modulation spectrum while keeping EVM substantially fixed; and further optimizing the values that optimize the modulation spectrum of the mobile terminal of the AM/AM and AM/PM coefficients in order to optimize a switching spectrum of the mobile terminal such that the values are first optimized for the modulation spectrum of the mobile terminal and are then optimized for the switching spectrum of the mobile terminal.

2. The method of claim 1 wherein prior to performing the first EVM correction, the method further comprises:

for each of the AM/AM coefficients, performing an initial search to find an initial value for the AM/AM coefficient that provides a modulation spectrum closest to a desired modulation spectrum; and for each of the AM/PM coefficients, performing an initial search to find an initial value for the AM/PM coefficient that provides a modulation spectrum closest to the desired modulation spectrum;

wherein for each of the AM/AM and AM/PM coefficients, performing the first EVM correction comprises varying the coefficient from the initial value to find a second value of the coefficient that provides a minimum EVM.

3. The method of claim 2 wherein for each of the AM/AM coefficients, performing the initial search comprises:

varying the AM/AM coefficient over a range of values;

each time varying the AM/AM coefficient varies the AM/AM coefficient from one of the range of values to another of the range of values:

providing one or more measurements of the modulation spectrum; and providing a spectrum weight value based on the one or more measurements and a predetermined weighting equation; and determining the initial value for the AM/AM coefficient that provides the modulation spectrum closest to the desired modulation spectrum based on the spectrum weight values.

4. The method of claim 2 wherein for each of the AM/PM coefficients, performing the initial search comprises:

varying the AM/PM coefficient over a range of values;

each time varying the AM/PM coefficient varies the AM/PM coefficient from one of the range of values to another of the range of values:
providing one or more measurements of the modulation spectrum; and
providing a spectrum weight value based on the one or more measurements and a predetermined weighting equation; and
determining the initial value for the AM/PM coefficient that provides the modulation spectrum closest to the desired modulation spectrum based on the spectrum weight values.

5. The method of claim 1 wherein determining values for the AM/AM and AM/PM coefficients comprises coarse tuning the AM/AM and AM/PM coefficients according to the at least one predetermined rule.

6. The method of claim 5 wherein coarse tuning the AM/AM and AM/PM coefficients comprises:
performing a series of coarse tuning steps, wherein each of the coarse tuning steps comprises varying one or more of the AM/AM coefficients or one or more of the AM/PM coefficients according to one of the at least one predetermined rule to find values for the AM/AM and AM/PM coefficients providing a modulation spectrum closest to a desired modulation spectrum.

7. The method of claim 6 wherein each time varying one or more of the AM/AM coefficients or one or more of the AM/PM coefficients varies the one or more of the AM/AM coefficients or the one or more of the AM/PM coefficients, the coarse tuning step further comprises:
providing measurements of the modulation spectrum; and
determining a spectrum weight based on the measurements of the modulation spectrum and a weighting equation;
wherein the modulation spectrum closest to the desired modulation spectrum is determined based on the spectrum weight.

8. The method of claim 6 wherein determining values for the AM/AM and AM/PM coefficients further comprises, for each of one or more of the AM/AM and AM/PM coefficients, performing a second Error Vector Magnitude (EVM) correction to find a value for the coefficient that provides a minimum EVM.

9. The method of claim 8 wherein determining values for the AM/AM and AM/PM coefficients further comprises fine tuning the AM/AM and AM/PM coefficients.

10. The method of claim 9 wherein fine tuning the AM/AM and AM/PM coefficients comprises:
performing a series of fine tuning steps, wherein each of the fine tuning steps comprises varying one or more of the AM/AM and AM/PM coefficients according to one of the at least one predetermined rule to find values for the AM/AM and AM/PM coefficients providing a modulation spectrum closest to the desired modulation spectrum.

11. The method of claim 10 wherein each of the EVM corrections, each of the series of coarse tuning steps, each of the second EVM corrections, and each of the series of fine tuning steps provides a set of values for either the AM/AM or the AM/PM coefficients, and the method further comprising:
selecting a preferred set of values for the AM/AM and AM/PM coefficients from the sets of values for the AM/AM and AM/PM coefficients based on at least one predetermined criteria.

12. The method of claim 1 wherein optimizing the AM/AM and AM/PM coefficients in order to optimize the switching spectrum of the mobile terminal comprises coarse tuning the AM/AM and AM/PM coefficients according to the at least one predetermined rule.

13. The method of claim 12 wherein coarse tuning the AM/AM and AM/PM coefficients comprises:
performing a series of coarse tuning steps, wherein each of the coarse tuning steps comprises varying one or more of the AM/AM coefficients or one or more of the AM/PM coefficients according to one of the at least one predetermined rule to find values for the AM/AM and AM/PM coefficients providing a switching spectrum closest to the desired switching spectrum.

14. The method of claim 13 wherein each time varying one or more of the AM/AM coefficients or one or more of the AM/PM coefficients varies the one or more of the AM/AM coefficients or the one or more of the AM/PM coefficients, the coarse tuning step further comprises:
providing measurements of the switching spectrum; and
determining a spectrum weight based on the measurements of the switching spectrum and a weighting equation;
wherein the switching spectrum closest to the desired switching spectrum is determined based on the spectrum weight.

15. The method of claim 12 wherein optimizing the AM/AM and AM/PM coefficients in order to optimize the switching spectrum of the mobile terminal further comprises fine tuning the AM/AM and AM/PM coefficients.

16. The method of claim 15 wherein fine tuning the AM/AM and AM/PM coefficients comprises:
performing a series of fine tuning steps, wherein each of the fine tuning steps comprises varying one or more of the AM/AM and AM/PM coefficients according to one of the at least one predetermined rule to find values for the AM/AM and AM/PM coefficients providing a switching spectrum closest to a desired modulation spectrum.

17. The method of claim 16 wherein coarse tuning the AM/AM and AM/PM coefficients and fine tuning the AM/AM and AM/PM coefficients provide a plurality of sets of values for the AM/AM or the AM/PM coefficients, the method further comprising:
selecting a preferred set of values for the AM/AM and AM/PM coefficients from the sets of values for the AM/AM and AM/PM coefficients based on at least one predetermined criteria.

18. A system for optimizing coefficients for polynomials defining Amplitude Modulation to Amplitude Modulation (AM/AM) and Amplitude Modulation to Phase Modulation (AM/PM) predistortion for a polar modulated transmit signal in a mobile terminal in order to optimize an Output Radio Frequency Spectrum (OFRS) of the mobile terminal, wherein the AM/AM and AM/PM predistortion compensates for AM/AM and AM/PM distortion of a power amplifier in a transmit chain of the mobile terminal, comprising:
a mobile terminal; and
an optimizer system communicatively coupled to the mobile terminal and adapted to:
for each AM/AM coefficient for the polynomial defining the AM/AM predistortion and each AM/PM coefficient for the polynomial defining the AM/PM predistortion, perform a first Error Vector Magnitude (EVM) correction to find a value of the coefficient that provides a minimum EVM;
determine values for the AM/AM and AM/PM coefficients to optimize a modulation spectrum of the mobile terminal by varying the AM/AM and AM/PM coefficients according to at least one predetermined rule defining a manner by which the AM/AM and AM/PM coefficients are varied to adjust the modulation spectrum while keeping EVM substantially fixed; and further optimize the values that optimize the modulation spectrum of the mobile terminal of the AM/AM and AM/PM coefficients in order to optimize a switching spectrum of the mobile terminal such that the values are first optimized for the modulation spectrum of the mobile terminal and are then optimized for the switching spectrum of the mobile terminal.

* * * * *